(12) United States Patent
Seaman

(10) Patent No.: US 8,358,064 B2  
(45) Date of Patent: Jan. 22, 2013

(54) LIGHT EMITTING AND/OR RECEIVING APPARATUS

(76) Inventor: Roger Seaman, London (GB)

( * ) Notice: Subject to any disclaimer, the term of this patent is extended or adjusted under 35 U.S.C. 154(b) by 270 days.

(21) Appl. No.: 12/733,622

(22) PCT Filed: Aug. 9, 2008

(86) PCT No.: PCT/GB2008/003022  
§ 371 (c)(1),  
(2), (4) Date: May 18, 2010

(87) PCT Pub. No.: WO2009/034301  
PCT Pub. Date: Mar. 19, 2009

(65) Prior Publication Data  
US 2010/0259159 A1  Oct. 14, 2010

(30) Foreign Application Priority Data  
Sep. 12, 2007 (GB) .................................. 0717798.3

(51) Int. Cl.  
*H01L 51/52* (2006.01)  
*H01L 31/12* (2006.01)

(52) U.S. Cl. .......................................... 313/507; 257/80

(58) Field of Classification Search .................. 136/259, 136/263; 257/84, 80; 313/507  
See application file for complete search history.

(56) References Cited

U.S. PATENT DOCUMENTS

| | | | | |
|---|---|---|---|---|
| 4,235,643 A | * | 11/1980 | Amick | 136/246 |
| 4,326,012 A | * | 4/1982 | Charlton | 429/9 |
| 4,481,265 A | * | 11/1984 | Ezawa et al. | 429/9 |
| 6,396,208 B1 | | 5/2002 | Oda et al. | |
| 2002/0122144 A1 | * | 9/2002 | Yoshida et al. | 349/61 |
| 2004/0004214 A1 | * | 1/2004 | Yamazaki et al. | 257/40 |
| 2004/0021413 A1 | * | 2/2004 | Ito et al. | 313/504 |
| 2005/0023975 A1 | * | 2/2005 | Lee et al. | 313/512 |
| 2005/0183764 A1 | | 8/2005 | Han et al. | |
| 2006/0118798 A1 | | 6/2006 | Lee | |
| 2008/0023712 A1 | * | 1/2008 | Mueller et al. | 257/98 |
| 2008/0266136 A1 | * | 10/2008 | Diba | 340/906 |

FOREIGN PATENT DOCUMENTS

| | | |
|---|---|---|
| CN | 1242135 A | 1/2000 |
| CN | 1703564 A | 11/2005 |
| EP | 1 187 213 A2 | 3/2002 |
| WO | WO 2006/110926 A2 | 10/2006 |
| WO | WO2007/073203 | 6/2007 |
| WO | WO 2007/073203 A1 | 6/2007 |

OTHER PUBLICATIONS

Niggemann et al., Diffraction Gratings and Buried Nano-Electrodes—Architectures for Organic Solar Cells, Thin Solid Films, vols. 451-452, Mar. 2004, pp. 619-623.

* cited by examiner

*Primary Examiner* — Nimeshkumar Patel  
*Assistant Examiner* — Steven Horikoshi  
(74) *Attorney, Agent, or Firm* — Levy & Grandinetti (57) ABSTRACT

A light emitting and/or receiving apparatus in the form of a panel comprising a lattice of electroluminescent conductive polymer, a layer of transparent conductor, a clear substrate above the other layers and an integrated reflective panel located within the lattice layer.

18 Claims, 8 Drawing Sheets

LIGHT EMITTING AND/OR RECEIVING APPARATUS

The Applicants claim priority to International Application Number PCT/GB2008/003022, filed on Sep. 8, 2008, which claims priority to Great Britain Application Number 0717798.3, filed on Sep. 12, 2007.

This invention relates to light emitting and/or receiving apparatus which can be used for a number of different functions.

The present invention utilises a reflective film, such as a diamond graded reflective film used in on-illuminated traffic signs and bollards in conjunction with a film lattice and can be in the form of a flat panel. The film material works in a similar fashion to the standard LED (light emitting diode) but can be manufactured into many shapes and it is believed that it will eventually be capable of producing more light (luminance) per watt output but will generate less heat.

According to the present invention a light emitting and/or receiving apparatus is in the form of a panel comprising a lattice of electroluminescent conductive polymer, a layer of transparent conductor, a clear substrate above the other layers and an integrated reflective panel located within the lattice layer.

According to one aspect of the invention a light emitting apparatus as set forth above the parts are arranged so that the lattice of electromagnetic conductive polymer is arranged to transmit light when subjected to an electric current, the transparent conductor is arranged to allow the emitted light be transmitted, the clear substrate is arranged to reflect a percentage of the emitted light back into the reflective panel and so that the integrated reflective panel transmits some of the light back through the clear substrate.

With this arrangement the construction can therefore involve a luminescent conductive polymer that emits light when subjected to an electric current, a transparent conductor (for example indium tin-oxide) can be used to allow the emitted light to be transmitted. An integrated reflector panel is placed within the lattice layer to reflect some of the light generated back through the clear substrate. The clear substrate is used on top of the other layers to reflect a percentage of the emitted light back into the panel and into a reflective panel which ensures that the reflected light is re-emitted back through the clear substrate.

With this arrangement the lattice can be structured to produce a grid of light that is of uniform shape. This will also have the advantage of a much more uniform light output and, when used in conjunction with the integrated reflective film cells, can produce a far greater performance than that of other light emitting products currently available.

According to a second aspect of the invention a light receiving apparatus, as set forth above, can be in the form of a solar panel which includes a number of thin film battery cells beneath the reflective panel and the lattice of electroluminescent polymer can be arranged to receive light and change it into electrical energy, means can be provided for delivering the electrical energy to the battery cells, and arranging for the actuating light to pass through the clear substrate and reflect from the reflector panel into the electroluminescent polymer.

According to a third aspect of the invention a light emitting and receiving apparatus, as set forth above, can include in layers from the top a clear substrate, a first transparent conductor, a first clear lattice of electroluminescent conductive polymer which can act as an emitter, a second conductive layer, a second clear lattice of electroluminescent polymer which is photovoltaic, an integrated reflective panel located within the said second lattice, thin film batteries beneath the integrated reflective panel, a backing and means for conducting said layers electrically so that the apparatus can collect light and emit light from the same side.

According to a fourth aspect of the invention a light emitting and receiving apparatus, as set forth above, can include a light emitting panel as set forth above arranged back-to-back with a light receiving panel as set forth above and electrically connected to receive light from one side and emit light from the other.

With the above light emitting and receiving apparatus constructions means can be incorporated for switching the panel from collecting light to emitting light and with such a construction the apparatus can include an emitter cathode, a photovoltaic cathode and a shared anode.

In all the above constructions the lattice or lattices of electroluminescent polymer can have a number of shaped openings which are oval, triangular, rectangular or polygonal.

In a preferred construction the shaped openings are hexagonal.

The reflective panel can be provided by a number of separate portions which are located in the openings in the lattice of electroluminescent polymer.

Preferably the various parts are carried on a backing which can be substantially rigid or flexible so that the panel can be rolled up or curved and with this arrangement a convenient material is flexible aluminium foil.

Thus, with these arrangements the backing can have a flexible protective substrate.

In convenient constructions the light emitting and/or receiving apparatus can be in the shape of a flat triangular panel.

The application also includes a lighting appliance incorporating a light emitting and/or receiving apparatus as set forth above.

Thus, the lighting appliance can be in the form of an illuminating or indicating lamp. Such a lamp can be provided on, for example, an article of road furniture such as a traffic bollard or, for example, in a greenhouse or for any other location where such a lamp is required. It can therefore also be used when any other light source is employed such as an office, retail or outdoor residential lighting.

The invention can be performed in various ways and some embodiments will now be described by way of example and with reference to the accompanying drawings in which.

Figure 1:
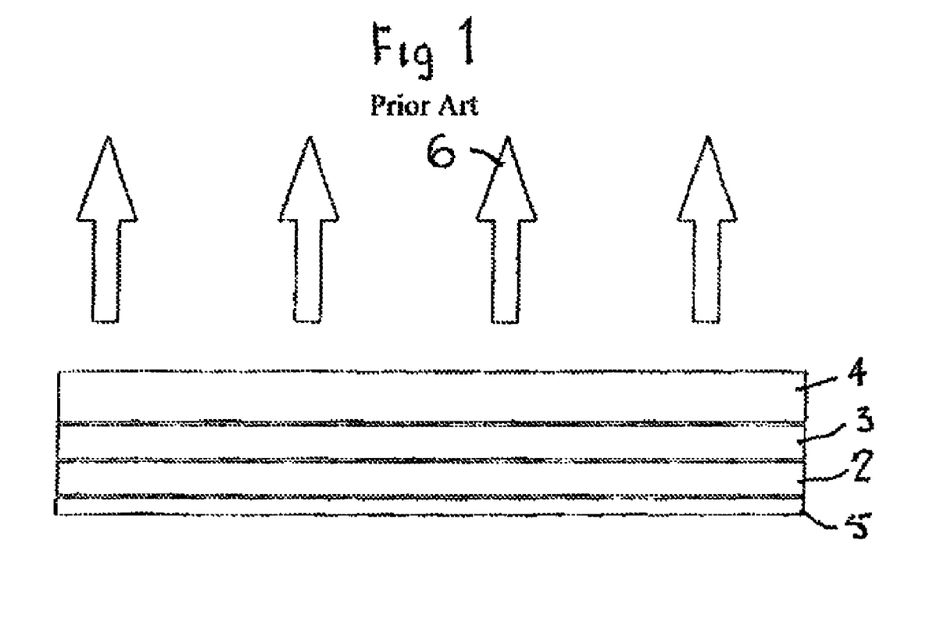
FIG. 1 is a diagram showing how a PLED (polymer light emitting diode) can be used in a reflective panel.

FIG. 1 shows the construction through a light emitting panel 1 a layer of P-OLED being indicated as a PLED (polymer light emitting diode) layer 2 that emits light which can be of any desired colour when subjected to an electric current. Above it a transparent conductor (Indium tin-oxide) 3 and a transparent clear substrate 4. An aluminium backing 5 is provided and light is emitted in the direction of the arrows 6 when the PLED is activated.

Figure 2:
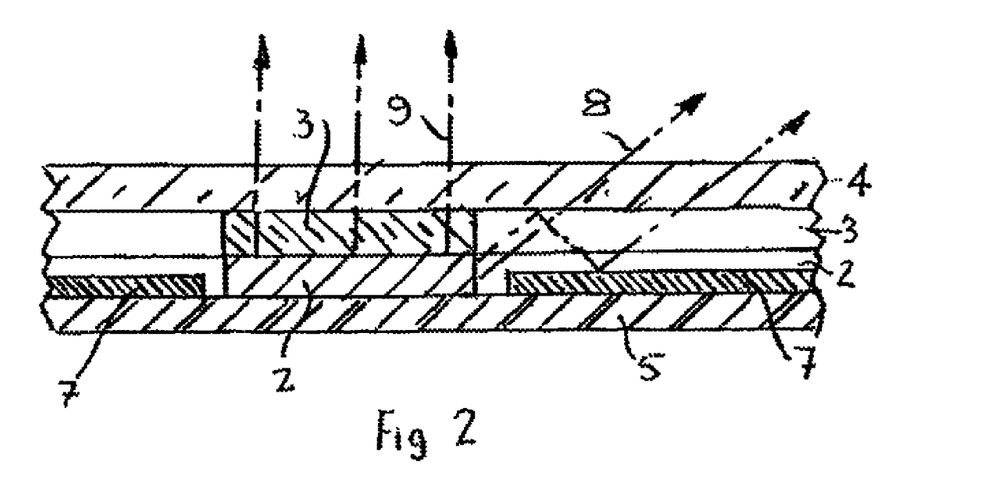
FIG. 2 is a diagrammatic cross-section of a light emitting and reflective panel according to the invention.

FIG. 2 shows a construction according to the invention which has a PLED layer 7 and an appropriate electrical connections. This is indicated by reference numeral 7 in FIG. 2. This panel reflects some of the light generated back through the clear substrate 4 as indicated by the arrows 8. Light emitted straight through the clear substrate 4 is indicated by arrows 9.

Figure 3:
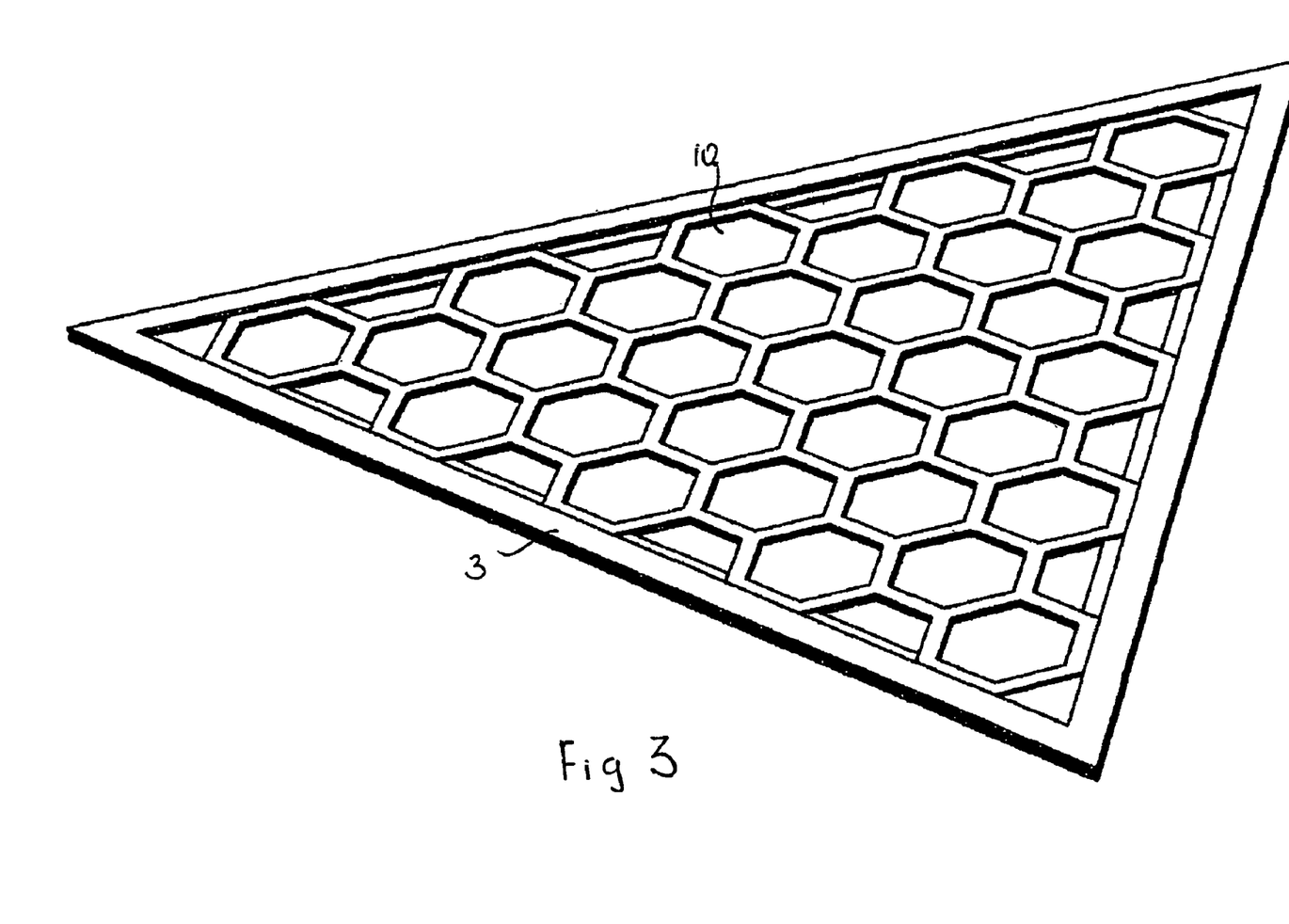
FIG. 3 is a diagrammatic perspective view of a lattice of electroluminescent conductive polymer used in the present invention.

The construction of the PLED 2 is in the form of a lattice, as shown in FIG. 3. This lattice 3 is structured to produce a grid of light that is of a uniform shape. This has the advantage of a much more uniform light output when used in conjunction with the integrated reflective film layer and can produce a greater performance than other light emitting products currently available.

The lattice can have any one of a number of shaped openings, for example oval, triangular, rectangular or polygonal and in the preferred construction as shown in FIG. 3 the openings are hexagonal and are indicated by reference number 10. This configuration is preferred because of its uniform balance through 360° for both the PLED film and the reflector on the panel. With this standard shape of panel it can be set with a wide variety of pitch sizes for use in any dedicated application.

Figure 4:
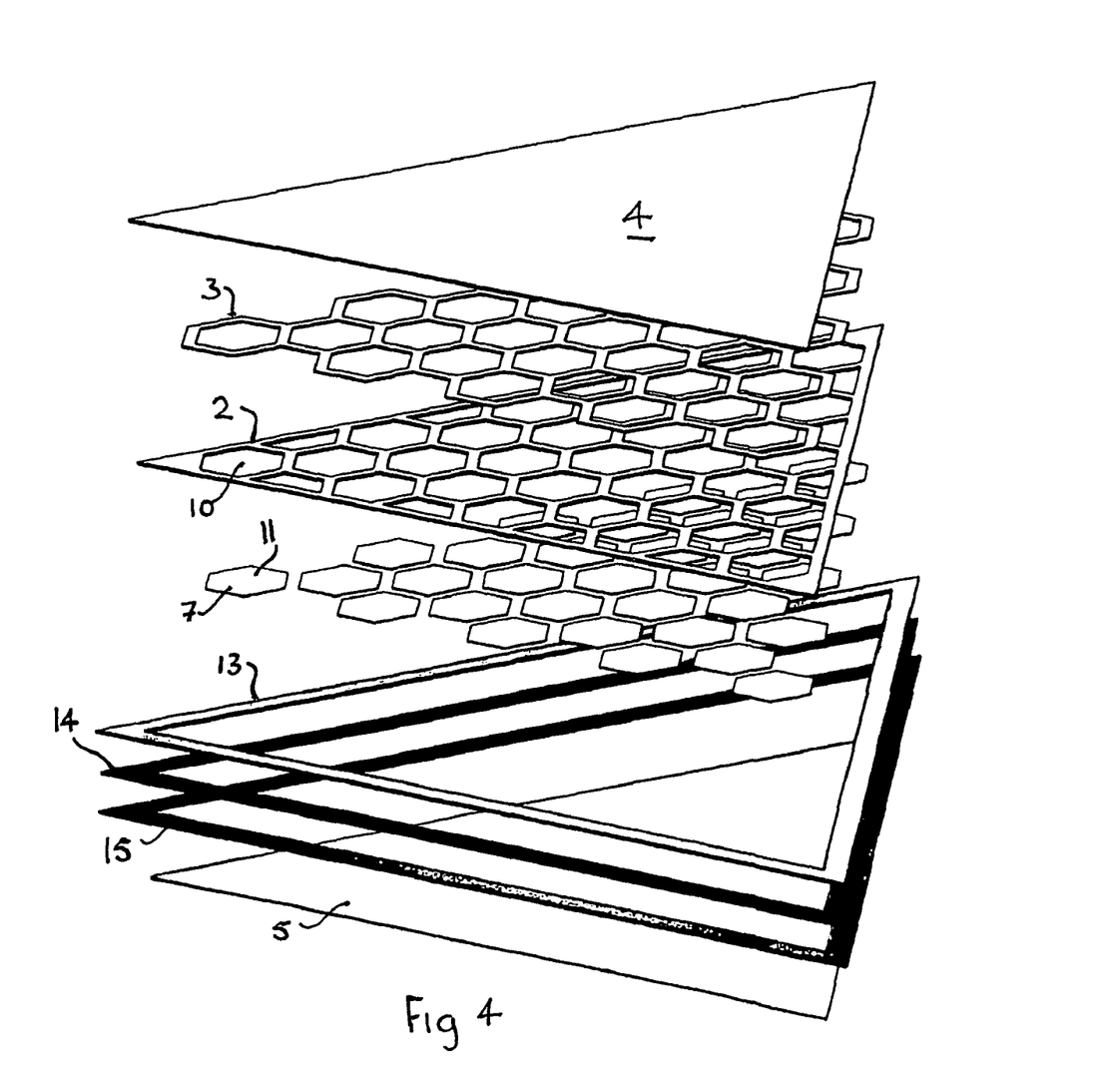
FIG. 4 is an exploded view of a light emitting panel employing the lattice of electroluminescent conductive polymer shown in FIG. 3.

FIG. 4 is an exploded view of the reflective panel and the same reference numerals are used to indicate the same parts as in the preceding Figures. This exploded view shows how the reflective layer 7 is made up of a number of hexagonal plates 11 which are located in the lower extremities of hexagonal openings 10 of the lattice 2.

As will be seen from FIG. 4 the panel can comprise the upper clear substrate layer 4, the clear conductive layer 3 of zinc indium-oxide which acts as an anode and has a configuration similar to the lattice 2 with which it is aligned. The reflective panel in the form of the hexagonal plates 11 are located in the opening 10 where the whole is mounted on an aluminium frame 13 which acts as an anode (+), the frame incorporates an insulator 14 and a lower aluminium frame 15 which acts as a cathode (−) the whole frame being carried on an aluminium backing 5.

As will be seen from the drawings the panel is of a triangular shape.

The lightweight aluminium backing 5 provides strength and durability and can be the voltage—VE cathode for the PLED panel 2. The frame provides a hard-backed panel for general lighting applications. The panel can alternatively be made flexible by replacing the base and frames 13 and 15 and providing a flexible insulator 14 and using a flexible aluminium foil as a base with a protective flexible substrate for portability. Thus, a flexible panel of this type can be rolled up and transported to remote places where it can be easily unrolled for use.

Reflector panels of this type can be used as an alternative to some of the lamps used currently in lighting, for example florescent and discharge lamps and because of their flexibility can replace some LED's because they can be more flexible and generate less heat. This product also has the advantage that it can be manufactured into virtually any shape and because all the light emitters and reflectors are on one thin panel. Units such as florescent tube fittings can be reduced down to one single replacement fitting. Furthermore, on the front of the reflective panel an opaque film can be placed (not shown on the drawings) in front of the clear substrate of the panel to diffuse the light from it. In an outdoor luminare for street lighting a reflector bowl and discharge lamp may be replaced with the PLED panel shaped into a bowl but having a higher performance due to the light re-reflected generated from the inner surface of the bowl being more uniform and having higher efficiency. The light from the panels can be manufactured to emit light much nearer to daylight and is much safer to use than florescent (low pressure mercury) and that it does not generate dangerous visible light frequencies and is much better suited than any other light source for office, retail or indoor residential lighting.

Moreover, the new panel is more environmentally friendly and follows the new WEEE (Waste Electronic & Electrical Engineering) Directive. In London there are as many as 3,000,000 street lighting units including illuminated signs and bollards, traffic signalling systems as well as standard light discharge systems a large saving in energy and a great reduction in carbon emissions is provided if the technology used in the panels, the subject of this invention. Cost on lamp maintenance servicing would also be reduced because the normal life of the product, when used everyday, is over 10 years.

At the end of its life the reflective can be safely broken down and recycled and the new WEEE Directive requires that manufacturers of all electrical or electronic products must take responsibility to recycle their products at the end of their life cycle. Existing lamps are manufactured mechanically are manufactured with mercury and other hazardous chemicals and destroying them is difficult. The present panels solve this problem and are cleaner and safer.

FIGS. 5 to 8 shows a light receiving apparatus which takes advantage of the same type of construction. This solar panel combines a version of the organic light emitting diode technology and reflective film technology used in the construction shown in FIGS. 1 to 4.

This construction produces electricity by changing the chemical formula slightly of the PLED to convert light into electricity. When combined with an integrated reflective layer it increases the light absorbed by the PLED to create more electrical energy and this panel has the added capability to store converted energy integrated on the same panel using batteries.

Figure 5:
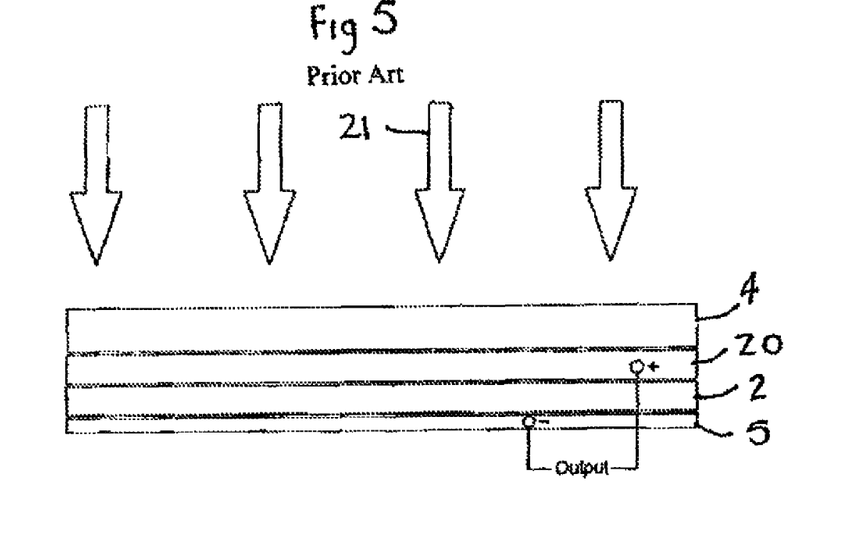
FIG. 5 is a diagram showing how a PLED can be used in reverse to the way shown in FIG. 1 to receive light.

FIG. 5 shows a construction similar to that shown in FIG. 1 and the same reference numerals are used to indicate similar parts. In this construction however the PLED layer 20 acts to receive light and change it into electrical energy. The source of light (daylight) is indicated by arrows 21.

Figure 6:
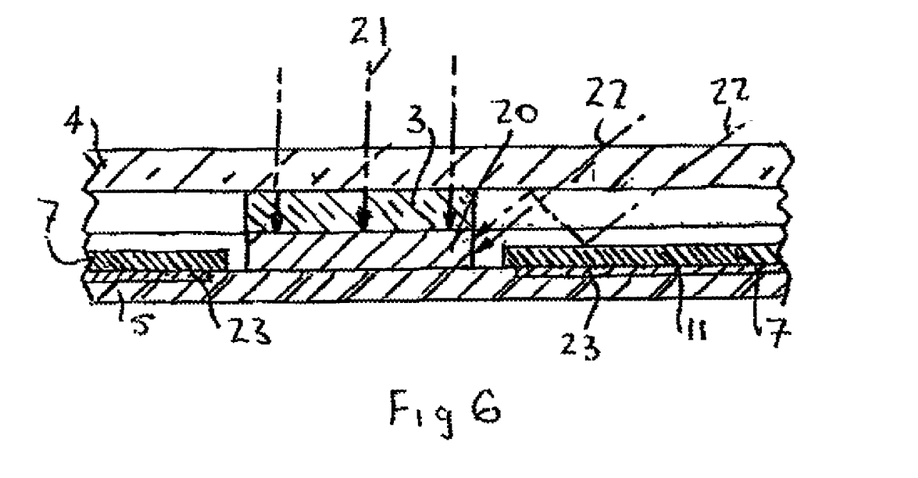
FIG. 6 shows a light receiving apparatus according to the invention which can change the light into electricity and store it.

FIG. 6 shows a cross-section through the panel, the incoming light being indicated again by arrows 21 and inclined incoming light indicated by arrows 22. The mirror panel 7 again reflects the light back onto the PLED layer 20. Thus this construction operates in the opposite direction to that shown in FIG. 2. Located beneath the mirror plate 11 are thin film batteries 23.

Figure 7:
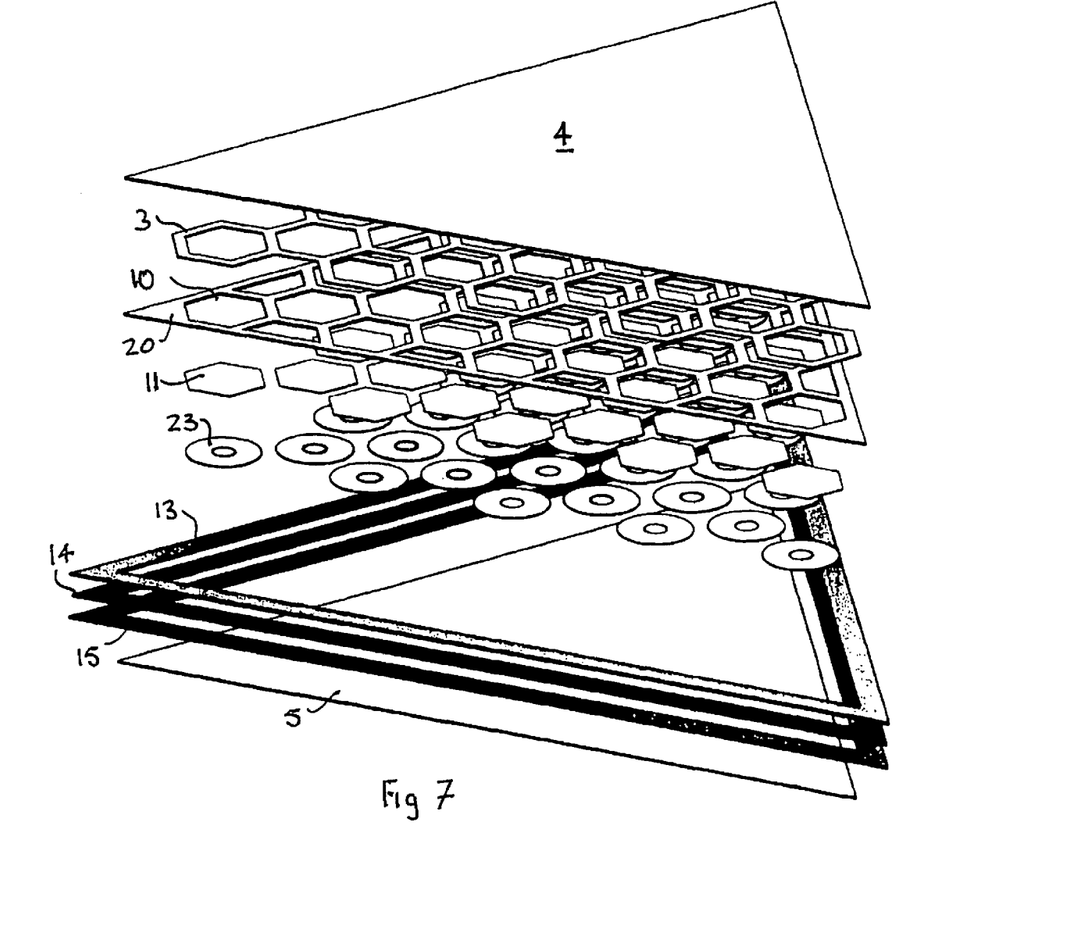
FIG. 7 is an exploded view of apparatus according to the invention in the form of a solar panel with electrical storage facility employing the invention.

FIG. 7 is a similar view to FIG. 4 but of the solar panel and again the same reference numerals are used to indicate similar parts. The position of the thin film batteries is clearly shown beneath the reflector plates 11 and the rigid and flexible constructions could be as described above.

The use of the thin film batteries 23 allows the panel to not require an outboard rechargeable battery. Each battery is connected directly to the surrounding PLED layer which is in close proximity, reducing the electrical resistance within the circuit. This further enhances the uniform flow of electricity throughout the entire panel.

Figure 8:
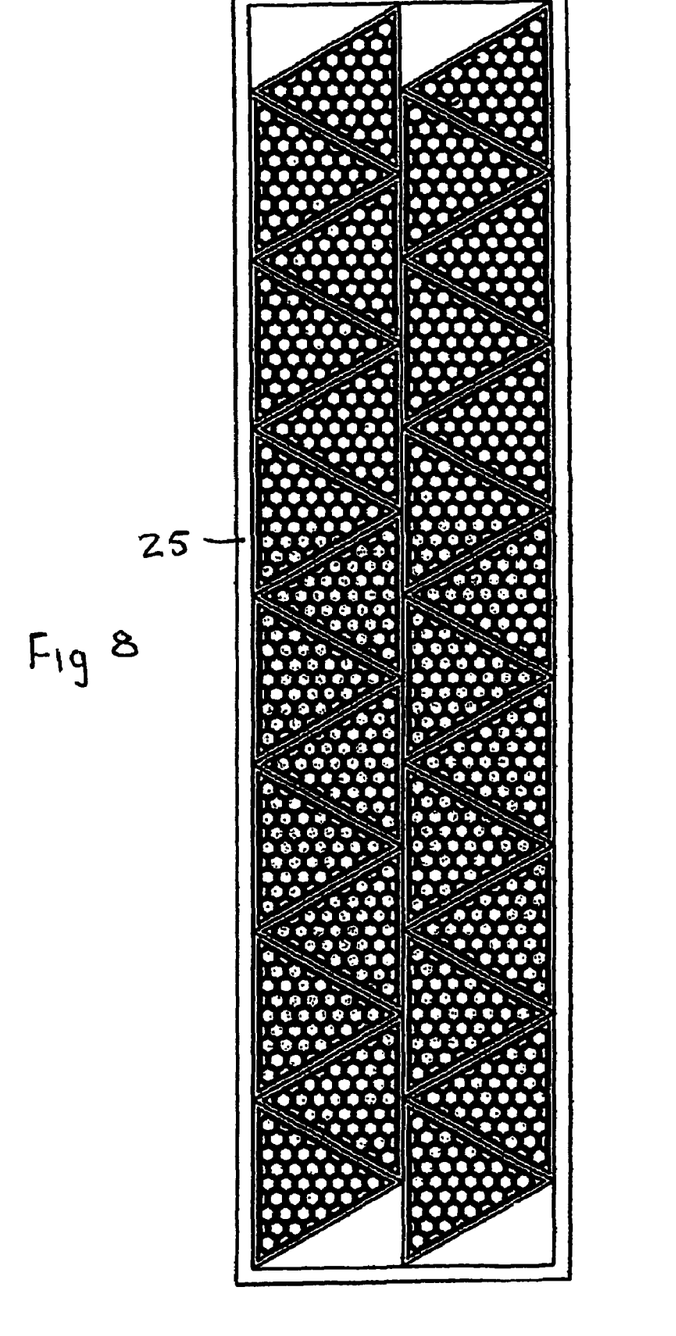
FIG. 8 is a front view of a number of panels of the type shown in FIG. 7 arranged together to form a reflective area.

It will be seen that the panels are again in a triangular shape so they can be segmented into a triangular box, approximately 10 $cm^2$ to 300 $cm^2$. Each cell can then be connected using aluminium rungs along the edges of a similar size cell. The panels can be manufactured as a multi-block panel or single piece-block segments that could be joined together using slots at the edges (not shown). Such a panel is shown In FIG. 8 where 28 triangular panels are interconnected with a frame 25.

The new panels, according to the invention, outperform existing solar panels producing more power, higher voltage outputs and better cooling. With the flexibility of these constructions they can be used for a wide variety of applications.

If required double-sided cell segments can be used for outdoor use and extend further the efficiency of the solar panel unit.

Figure 9:
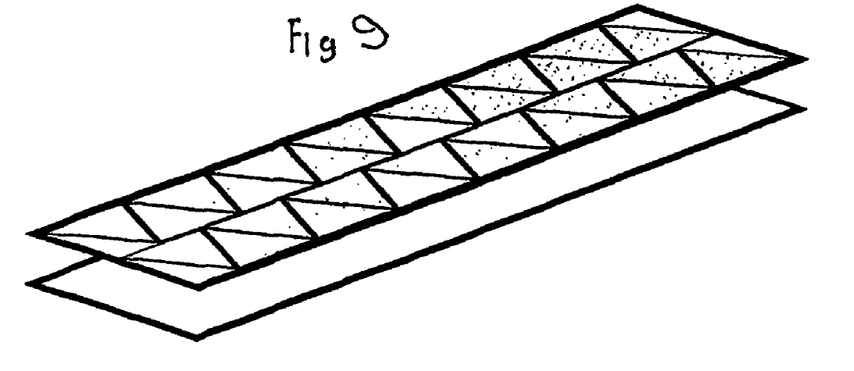
FIG. 9 shows how light receiving panels as shown in FIGS. 6, 7 and 8 can be used in combination with light emitting panels as shown in FIGS. 2 to 4 to receive light on one side and emit light on the other.

In the construction shown in FIG. 9 two sets of panels are used back-to-back. The top set is as constructed according to FIGS. 6 to 8 and which acts as a solar panel and the lower panel is made from units as shown in FIGS. 2 to 4 but put together in panels similar to that shown in FIG. 8 so that with the light receiving panel on the top and a light emitting panel beneath it arranged back-to back to received light from one side and emit it from the other. Such constructions can be used in, for example, an eco-greenhouse. When the sun rises it charges the solar panel and as the sun sets the stored charge is fed through the other side of the construction converting the stored energy back into light energy thus ensuring that the greenhouse is always lit (suitable electrical connections being provided).

The technology can also be used employing a photovoltaic reflective panel with thin film batteries located on a dome. The panels can be arranged to follow the profile of the dome so that as the sun moves across the sky during the day the panel is able to absorb more of the available light energy from the atmosphere.

The solar panels, according to the invention, can also be taken to remote places and can be rolled up for transport. Once again the panels can be double sided solar/light panels.

Figure 10:
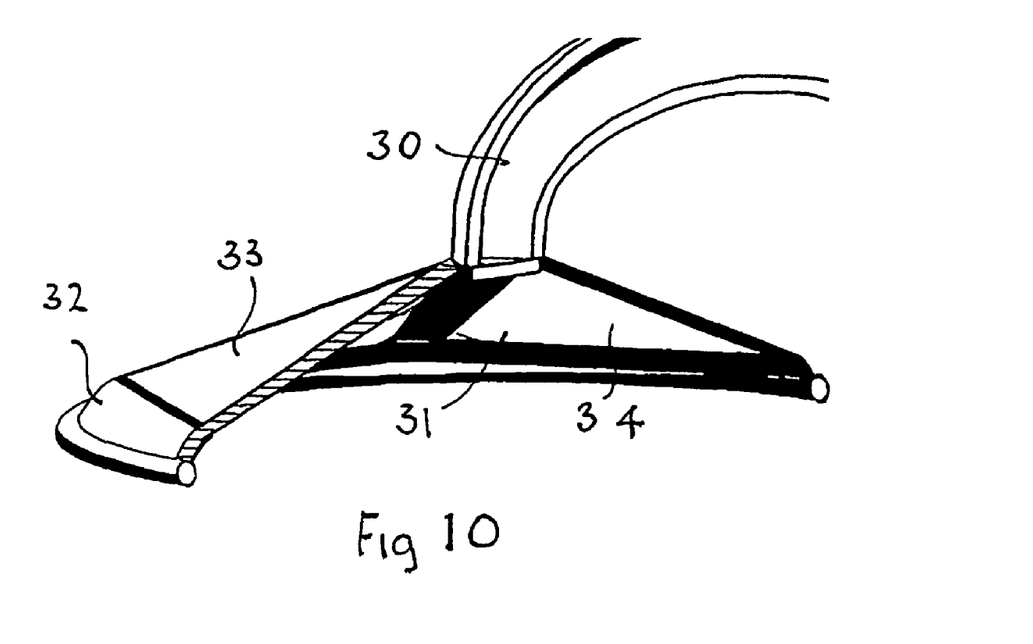
FIG. 10 is a diagrammatic, isometric part-cross-sectional view showing how the invention can be applied to an overhead street light.

FIG. 10 shows another use of the back-to-back panels shown in FIG. 9 incorporated in a street lamp. The lamp has a support 30 on which is located a light emitting panel 31 according to the invention above which is a shade or cover 32. The shade or cover caries a series of solar panels 33 located on its upper surface and the light emitting panels are carried on the lower surface of a light emitter dish 34, the panels being electrically connected appropriately. Such a construction is useful for street lights which will absorb light during the day but emit light at night. It can also be used for luminated bollards, double-sided signs, bus stops displays and many other applications.

Figure 11:
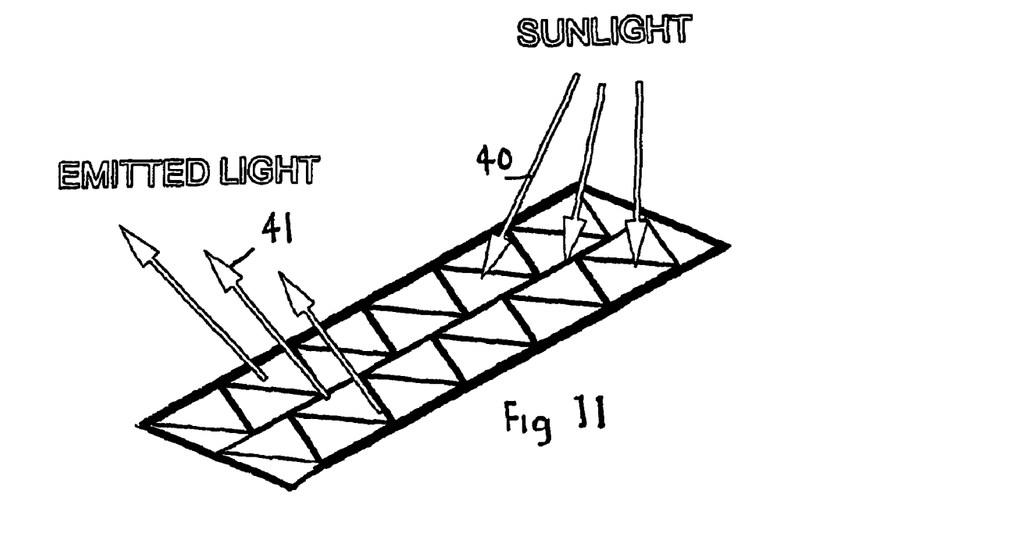
FIG. 11 is a diagram showing how panels of the type shown in FIGS. 2 to 4 and 6 to 7 are combined to provide a light emitting and receiving panel.

FIG. 11 shows another application of the invention which provides a light emitting and receiving apparatus. With this construction, as shown in FIG. 11, a light emitting and receiving panel can be arranged so that sunlight is received on one side and emitted light on the same side, as indicated by the arrows 40, 41.

Figure 12:
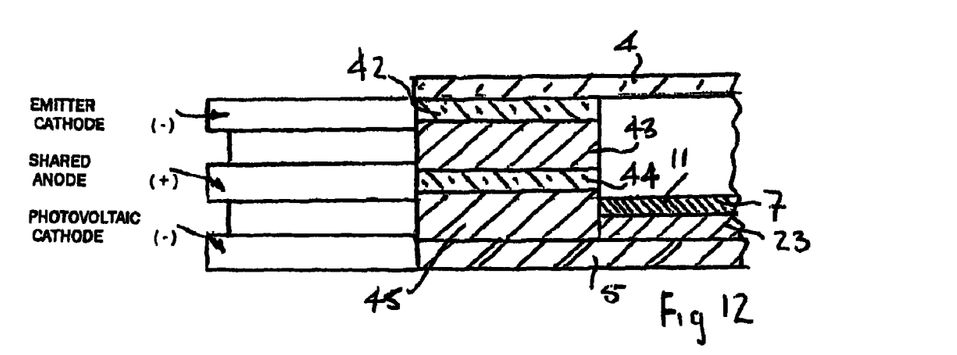
FIG. 12 is a diagrammatic part-cross-section through the panel shown in FIG. 11; and, FIG. 13 shows how the apparatus made according to FIGS. 11 and 12 can be used on a traffic bollard.

FIG. 12 shows a part-cross-sectional view of this construction and again the same reference numerals are used to indicate similar parts to those shown in FIGS. 2 to 4 and 6 and 7. Thus the panel is of similar configuration to those shown in FIGS. 4 and 7 but comprises, in layers from the top, the clear substrate 4, a first clear lattice of electroluminescent conductive polymer which can act as an emitter 43, a second conductive layer 44, a second clear lattice of electroluminescent conductive polymer 45 which is photovoltaic, an integrated reflective panel 7 which can comprise the reflective plates 11 and within the second lattice 45, thin film batteries 23 similar to those shown in FIG. 7 beneath the integrated reflective panel and a backing 5. Means (not shown) are provided for connecting the layers electrically so that the apparatus can collect light and emit light from the same side.

Thus, this panel uses the light emitter conductor polymer stacked on top of the photovoltaic and incorporates and shares the same reflective layer.

This type of panel is particularly useful for illuminated traffic bollards, street signs and street shop-front displays. Moreover, the dual layer power may also be used for eco greenhouse saving space, money and is 100% non carbon emitting.

Incorporated within the panel a suitable integrated switch controller (not shown) can be arranged to sense the drop in voltage of the photovoltaic lattice and then switch over to convert the stored energy within the batteries to the light emitting first clear lattice which will emit the light appropriately.

If required, some of the surface energy from the voltaic film lattice can be connected to a series of back-up batteries (not shown) for a better performance when emitting light.

This dual purpose panel reflects incoming light to be converged by the photovoltaic film and then dissipating the light emitted by the light emitting film. This reduces the panel size and saves the cost of producing two separate function delegated panels.

Figure 13:
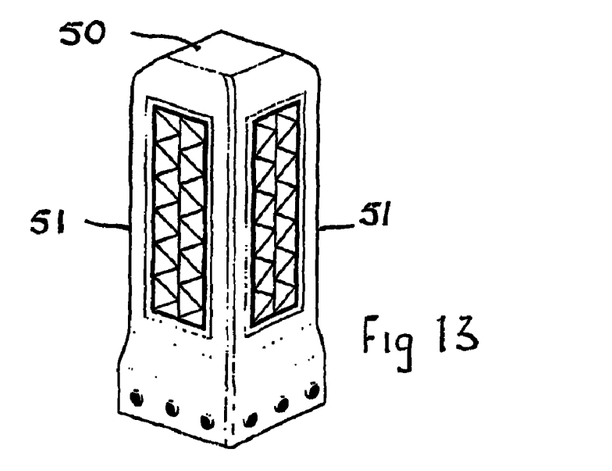

FIG. 13 shows how this type of panel can be used on a traffic bollard indicated by reference numeral 50 and the sides 51 of which are provided with the panels.

The invention claimed is:
1. A light emitting and receiving apparatus in the form of a panel comprising,
in layers from the top,
a clear substrate,
a first transparent conductor,
a first clear lattice of electroluminescent conductive polymer which can act as an emitter,
a second conductive layer,
a second clear lattice of electroluminescent conductive polymer which is photovoltaic,
an integrated reflective panel located within the second lattice, and
thin film batteries beneath said integrated reflective panel and a backing; and means for connecting said layers electrically so that the apparatus can collect light and emit light from the same side.
2. A light emitting and receiving apparatus as claimed in claim 1 in which the parts are arranged so that the first clear lattice of electroluminescent conductive polymer is arranged to transmit light when subjected to an electric current, the first transparent conductor is arranged to allow the emitted light to be transmitted, the clear substrate is arranged to reflect a percentage of the emitted light back into the reflective panel and so that the integrated reflector panel transmits some of the light back through the clear substrate.

3. A light emitting and receiving apparatus as claimed in claim 2 in which said lattices of electroluminescent polymer has a number of shaped openings which are oval, triangular, rectangular or polygonal.

4. A light emitting and receiving apparatus as claimed in claim 1 in the form of a solar panel which includes a number of thin film battery cells beneath the reflective panel and the second clear lattice of electroluminescent polymer is arranged to receive light and change it into electrical energy, means for delivering the electrical energy to said battery cells, and arranging for the actuating light to pass through the clear substrate and reflect from the reflective panel into the electroluminescent polymer.

5. A light emitting and receiving apparatus as claimed in claim 1 including means for switching the panel from collecting light to emitting light.

6. A light emitting and receiving apparatus as claimed in claim 1 in which the apparatus includes an emitter cathode, a photovoltaic cathode and a shared anode.

7. A light emitting and receiving apparatus as claimed in claim 6 in which the shaped openings are hexagonal.

8. A light emitting and receiving apparatus as claimed in claim 3 in which the reflective panel is provided by a number of separate portions which are located in the openings in the lattices of electroluminescent polymer.

9. A light emitting and receiving apparatus as claimed in claim 1 in which the various parts are carried on a backing.

10. A light emitting and receiving apparatus as claimed in claim 9 in which the backing is substantially rigid.

11. A light emitting and receiving apparatus as claimed in claim 9 in which the backing is made from flexible aluminum foil.

12. A light emitting and receiving apparatus as claimed in claim 11 in which said backing has a flexible protective substrate.

13. A light emitting and receiving apparatus as claimed in claim 1 which is formed in the shape of a flat triangular panel.

14. A lighting appliance incorporating a light emitting and receiving apparatus as set forth in claim 1.

15. A lighting appliance as claimed in claim 14 which is in the form of an illuminating display lamp.

16. A lighting appliance as claimed in claim 14 in which the lamp is provided on an article of road furniture.

17. A lighting appliance as claimed in claim 14 in which the lamp is incorporated in a greenhouse.

18. A light emitting and receiving apparatus in the form of a panel comprising:
  a lattice of electroluminescent conductive polymer;
  a layer of transparent conductor;
  a clear substrate above the other layers and an integrated reflective panel located within the lattice layer; and
  a light emitting panel, said light emitting panel comprises,
  parts arranged so that the lattice of electroluminescent conductive polymer is arranged to transmit light when subjected to an electric current, the transparent conductor is arranged to allow the emitted light to be transmitted, the clear substrate is arranged to reflect a percentage of the emitted light back into the reflective panel and so that the integrated reflective panel transmits some of the light back through the clear substrate, said light emitting panel is arranged back-to-back with a light receiving panel, said light receiving panel comprises,
  a solar panel which includes a number of thin film battery cells beneath a second integrated reflective panel located within a second lattice of electroluminescent polymer, which is arranged to receive light and change it into electrical energy, means for delivering the electrical energy to said battery cells, and arranging for the actuating light to pass through a second clear substrate and reflect from the second reflective panel into the electroluminescent polymer, said light emitting and receiving apparatus is electrically connected to receive light from one side and emit light from the other.

* * * * *

UNITED STATES PATENT AND TRADEMARK OFFICE
CERTIFICATE OF CORRECTION

PATENT NO. : 8,358,064 B2  Page 1 of 1
APPLICATION NO. : 12/733622
DATED : January 22, 2013
INVENTOR(S) : Roger Seaman It is certified that error appears in the above-identified patent and that said Letters Patent is hereby corrected as shown below:

ON THE TITLE PAGE:

Please correct Item (22) PCT Filed as follows:

(22) PCT Filed: ~~Aug. 9, 2008~~ <u>Sep. 8, 2008</u>

Signed and Sealed this
Thirtieth Day of July, 2013

Teresa Stanek Rea
*Acting Director of the United States Patent and Trademark Office*